United States Patent
Heyne

(10) Patent No.: US 7,414,445 B2
(45) Date of Patent: Aug. 19, 2008

(54) DEVICE AND METHOD FOR THE SYNCHRONIZATION OF CLOCK SIGNALS AND ADJUSTMENT OF THE DUTY CYCLE OF THE CLOCK SIGNAL

(75) Inventor: Patrick Heyne, München (DE)

(73) Assignee: Qimonda AG, Munich (DE)

( * ) Notice: Subject to any disclaimer, the term of this patent is extended or adjusted under 35 U.S.C. 154(b) by 42 days.

(21) Appl. No.: 11/497,848

(22) Filed: Aug. 2, 2006

(65) Prior Publication Data
US 2007/0182470 A1  Aug. 9, 2007

(51) Int. Cl.
H03L 7/06 (2006.01)
(52) U.S. Cl. .................. 327/158; 327/149; 327/175; 365/233.1
(58) Field of Classification Search .......... 327/141, 327/144, 146–149, 155–159, 161–163, 172–175; 365/233
See application file for complete search history.

(56) References Cited

U.S. PATENT DOCUMENTS 6,127,866 A * 10/2000 Chu et al. ............... 327/158
6,486,716 B1 * 11/2002 Minami et al. ........... 327/152
6,642,760 B1 * 11/2003 Alon et al. ............... 327/158
7,199,625 B1 * 4/2007 Chung .................... 327/149
2003/0067015 A1 4/2003 Drexler

FOREIGN PATENT DOCUMENTS

EP  0964517 A2  12/1999

OTHER PUBLICATIONS

"Digital delay locked loop with open-loop digital duty cycle corrector for 1.2Gb/s/pin double data rate SDRAM", Chunseok Jeong, Changsik Yoo, Jae-Jin Lee, and Joongsik Kih, IEEE, 2004.

* cited by examiner

Primary Examiner—N. Drew Richards
Assistant Examiner—Patrick O'Neill
(74) Attorney, Agent, or Firm—Dicke, Billig & Czaja, PLLC

(57) ABSTRACT

A device for synchronizing an input clock signal with an output clock signal is disclosed. One embodiment includes includes a bistable trigger circuit for controlling the edges of a clock signal fed to a first delay, a second phase comparator for determining the phase between the first clock signal delayed by the first delay and the input clock signal, and a second controller for controlling the delay of the first clock signal in correspondence with the phase determined by the second phase comparator.

22 Claims, 2 Drawing Sheets

DEVICE AND METHOD FOR THE SYNCHRONIZATION OF CLOCK SIGNALS AND ADJUSTMENT OF THE DUTY CYCLE OF THE CLOCK SIGNAL

CROSS-REFERENCE TO RELATED APPLICATIONS

This Utility Patent Application claims priority to German Patent Application No. DE 10 2005 036 559.0 filed on Aug. 3, 2005, which is incorporated herein by reference.

BACKGROUND

The invention relates to a device for the synchronization of a clock signal used in a semiconductor chip with a predetermined clock signal with the simultaneous adjustment of the duty cycle of the clock signal. The invention in particular relates to a device for the synchronization of the clock signal used internally in a semiconductor chip with a clock signal supplied to the semiconductor chip from outside, wherein the length of the duty cycle of the clock signal is adjusted simultaneously.

In semiconductor devices, in particular in memory devices such as DRAMs (DRAM=Dynamic Random Access Memory and/or dynamic read write memory) that are, for instance, based on CMOS technology, clock signals are used for the chronological co-ordination of the processing and/or relaying of the data. Conventional semiconductor devices in general use a "single ended" clock signal CLK that is present on a single line for this purpose.

The data are then, for instance, relayed or processed at the respective rising edge of the single-ended clock signal CLK (or, alternatively, e.g., at the respective falling edge of the single-ended clock signal).

Furthermore, DDR devices, in particular DDR-DRAMs (DDR-DRAM=Double Data Rate DRAM) are known from prior art. In prior art DDR devices, the data are processed at both clock edges, so that the data are relayed and/or processed both at the rising and at the falling edges of the clock signal.

This means that data are relayed and/or processed more frequently and/or faster (in particular twice as frequently and/or twice as fast) in a DDR device than with corresponding, conventional devices in which the processing and/or relaying is performed at one of the clock signal edges only.

The clock signal supplied to such devices has a very high frequency. Therefore, to increase the insensitivity to disturbances, the clock signal may once be supplied to the device as clock signal CLK and, in parallel, as inverted clock signal bCLK on a further line, so that two clock signal lines are guided to the device.

In the case of systems that are clocked this way it is, on the one hand, important that signals that are output by the semiconductor device are always output at the same clock frequency as the input clock signal CLK, i.e. are present at the outputs of the semiconductor chip with the same clock frequency as the input clock signal CLK. On the other hand, the signals also have to be coordinated in time with the input clock signal CLK such that the edges of the output signals coincide in time with the edges of the input clock CLK, so that the signals are synchronized for the further processing in a subsequent device. The output signals of such a device thus may not include any phase shifting vis-à-vis the supplied input clock signal.

On the other hand, it is necessary for DDR devices that, if possible, an equal amount of time passes between the edges of the clock signals CLK or bCLK, respectively, so that both clock states—high and low—have the same duration. The "duty cycle" that is defined as the relation of the duration of the positive signal portion, i.e. high, to the clock length of the clock signal, should consequently be 50%.

The clock signal used in a DDR semiconductor chip thus has to be synchronized with the externally present clock signal CLK and furthermore has to include a duty cycle of exactly 50%. This applies in analogy for the inverted clock signal bCLK.

The external clock signal(s), i.e. the clock signal CLK and the inverted clock signal bCLK, is/are generated by an appropriate external clock signal generator connected with the device.

For the desired synchronization of the clock signal DQS or of the inverted clock signal bDQS used in the semiconductor device with the externally supplied input clock signals CLK or bCLK, the use of a clock signal synchronizer, for instance, a delay locked loop (DLL) is known from prior art. Such a DLL delays the externally supplied clock signal CLK or bCLK such that this delay effects, along with the inherent clock delay that will inevitably occur in the subsequent semiconductor device, that the edges of the output signals of the semiconductor device are synchronized with the edges of the clock signal CLK or bCLK and do not exhibit any phase shifting, i.e. coincide in time. In the case of frequency changes of the clock signals CLK or bCLK, the clock signals DQS or bDQS used in the semiconductor device are correspondingly readjusted in the delay. Such as DLL circuit is, for instance, known from EP 964 517.

A clock signal synchronizer includes, for instance, a first delay means (delay chain) which the external clock signal CLK or bCLK is fed to as input signal and which delays same. The output clock signal of the delay means is supplied—usually both to an off-chip driver (OCD) and, at any rate, also—to a feedback delay element. In the feedback delay element, there are reproduced the delay characteristics of the semiconductor device that follows the device in the signal path of the output clock signal and for which the input clock signal CLK is to be synchronized. The feedback delay element is thus a second delay means and delays the signal supplied thereto—ideally—like the semiconductor device that obtains the output signal of the device as clock signal. The output signal (FB) of the feedback delay element is fed to a phase comparing means, e.g., a comparator or phase detector, as input signal, which compares the signal FB with the input clock signal CLK. The output signal of the phase comparing means which describes the phase shifting between the signals FB and CLK is fed to a control element that adjusts, via an appropriate control signal, the delay effected in the first delay element (delay chain) to the desired value. If the phase of the FB signal is faster than the CLK signal, the control element effects a step-wise increase of the delay via an increment signal. In analogy, if the phase of the FB signal is slower than the CLK signal, the control element effects, by means of a decrement signal signalized to the first delay element, the decreasing of the delay. This control cycle of the delay locked loop (DLL) thus effects that the signal output by the OCD is delayed vis-à-vis the input clock signal as described above and as desired.

Such a clock signal synchronizer—the functioning of which has been described in a strongly abbreviated manner—does, however, have the disadvantage that the duty cycle of the output clock signal is not changed, but has the value of the input clock signal CLK fed to the device.

For adapting the duty cycle, there are, for instance known circuits from prior art which are connected in series to a clock signal synchronizer, i.e. a DLL, in the path of a clock signal.

Such an adaptation of the duty cycle which is separate from the adaptation of the delay does, however, illustrate disadvantages vis-à-vis a combination in a circuit. In the case of an integration of a duty cycle corrector (DCC) in a DLL, at least the input and output stages that are required for level adaptation could, for instance, be used jointly.

For these and other reasons, there is a need for the present invention.

SUMMARY

The present invention provides a device for synchronizing an input clock signal with an output clock signal. In one embodiment, the device includes a first variable, controllable delay for generating a first clock signal and at least a second clock signal from a clock signal fed to the first delay, a second delay, a first phase comparator, and a first controller. A bistable trigger circuit is provided for controlling the edges of the clock signal fed to the first delay. A second phase comparator is provided for determining the phase between the first clock signal delayed by the first delay and the input clock signal. A controller is provided for controlling the delay of the first clock signal in correspondence with the phase determined by the second phase comparator.

One embodiment of the invention provides a device for the synchronization of clock signals which also adjusts the length of the duty cycle to the desired 50%, and in further suggesting a corresponding method, wherein the disadvantages known from prior art are—at least partially—avoided.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

In accordance with one embodiment of the invention there is a device for the synchronization of an input clock signal with an output clock signal.

The device includes first variable, controllable delay for generating a first clock signal and at least a second clock signal from a clock signal fed to the first delay means, and a second delay means reproducing the characteristics of the delay of devices processing the output clock signal.

First phase comparing means is provided for determining the phase between the input clock signal and a clock signal delayed by the second delay means, and first control means for controlling the delay of the second clock signal in the first delay means in correspondence with the phase determined by the first phase comparing means. The device further includes a flip-flop for controlling the edges of the clock signal fed to the first delay means, second phase comparing means for determining the phase between the first clock signal that has been delayed by means of the first delay means and the input clock signal, and second control means for controlling the delay of the first clock signal in correspondence with the phase determined by the second phase comparing means.

The length of the duty cycle that is adjusted with such a device and the first signal that has the same duty cycle as the second signal is impacted with the desired delay.

Figure 1:
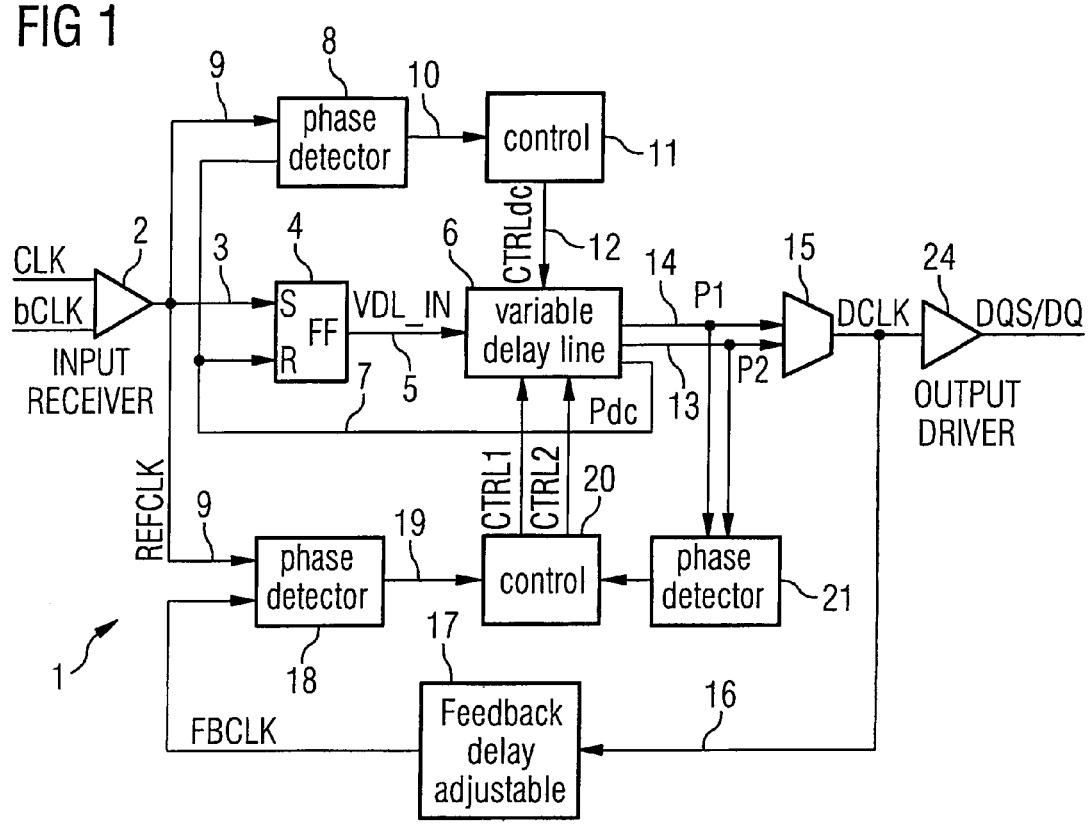
FIG. 1 illustrates a schematic representation of an inventive device.

FIG. 1 illustrates an inventive synchronizer 1 which is fed, via a co-called input receiver 2, with a clock signal CLK and an inverted or differential clock signal bCLK. The input receiver 2 generates a reference clock signal REFCLK from the fed clock signals CLK or bCLK, the voltage of the reference clock signal REFCLK being adapted to the requirements of the synchronizer 1.

The clock signal REFCLK is, via a line 3, transmitted to the set input of a bistable trigger circuit 4. The bistable trigger circuit may, for instance, be a flip-flop. The output signal of the bistable trigger circuit 4 is thus set to high level by a rising edge of the reference clock signal REFCLK, so that the bistable trigger circuit 4 passes through the rising edge of the clock signal REFCLK. The output signal of the bistable trigger circuit 4 is, via the line 5, fed to a first delay means 6, a variable delay line, as input signal VDL_IN. The high level of the input signal VDL_IN of the first delay means 6 remains in the state high until it is, via a signal that is present at the reset input of the bistable trigger circuit 4, set to low. Such a signal may, for instance, be a rising signal edge.

The delay means 6 includes at least two, in the instant embodiment three outputs at which three synchronized signals $P_1, P_2, P_{dc}$ are present. Since the output signals $P_1, P_2$ and $P_{dc}$ are derived from the same input signal VDL_IN and are tapped with different delays $T_1, T_2, T_{dc}$ only, the signals $P_1, P_2, P_{dc}$ have the same frequency and the same duty cycle.

The signal $P_{dc}$ provided by the delay means 6 is, via a line 7, transmitted to the reset input of the bistable trigger circuit 4, so that a rising edge of the reference clock signal REFCLK is delayed by a first delay value $T_{dc}$ in the first delay means 6, and subsequently, after the rising edge has passed through the first delay element 6, sets the input signal VDL_IN of the first delay means 6 to low level via the RESET input of the bistable trigger circuit 4. By means of this delay value $T_{dc}$ it may therefore be controlled how long the high level of the input signal VDL_IN of the first delay means 4 lasts. In this respect, it has to be borne in mind that the entire duration of the high level of the VDL_IN signal is the sum of the delay value $T_{dc}$ and the inherent signal delay by the bistable trigger circuit 4.

The signal $P_{dc}$ is further fed to a phase comparing means 8, which may be a comparator, and which receives, via the line 9, the reference clock signal REFCLK as input signal. The phase comparing means 8 determines the phase, i.e. the duration, between the falling edge of the signal $P_{dc}$ and the rising edge of the reference clock signal REFCLK and generates a corresponding signal that is transmitted to a control means 11 via the line 10. On the basis of this signal the control means 11 determines a control signal $CTRL_{dc}$ and transmits same, via the line 12, to the first delay means 6. By means of the control signal $CTRL_{dc}$ the control means 11 effects a prolongation of the delay time $T_{dc}$ if the falling edge of the signal $P_{dc}$ lies before the next rising edge of the reference clock signal REFCLK with respect to time. If the falling edge of the signal $P_{dc}$ follows the reference clock signal REFCLK, the control means 11 correspondingly effects a shortening of the delay time $T_{dc}$. This way, the duration of the duty cycle of the signal VDL_IN is, by means of the adjustment of the delay time $T_{dc}$, adjusted such that it is 50%.

A change of the reference clock REFCLK would first result in a deviation of the duty cycle value of 50%. With an increase of the frequency CLK or bCLK and a resulting higher reference clock REFCLK, the next rising edge of the reference clock signal REFCLK would lie before the falling edge of the signal $P_{dc}$ with respect to time. This diverging of the edges with respect to time would, however, be prevented by a corresponding control signal $CTRL_{dc}$ of the control means 11 which effects a shortening of the delay time $T_{dc}$. Correspondingly, in the case of a reduction of the frequency of the first clock signal CLK or bCLK, the delay time $T_{dc}$ is increased, so that the duty cycle is readjusted in both cases of frequency change.

The first delay means 6 generates, from the input signal VDL_IN, the clock signals $P_1$ and $P_2$ which are guided on the lines 13 and 14. The clock signal $P_1$ is derived from the signal VDL_IN by a delay $T_1$, the clock signal $P_2$ is in analogy derived from VDL_IN with a delay of $T_2$, so that both clock signals $P_1$, $P_2$ have the same duty cycle as the signal VDL_IN, but are delayed vis-à-vis thereto by the delay time $T_1$ or $T_2$, respectively.

One of the clock signals $P_1$, $P_2$ is transmitted as signal Delayed CLocK (DCLK) via a multiplexer 15 and is, via the line 16, fed to a second delay means 17, a feedback delay. The second delay means 17, which is adjustable, delays the fed signal DCLK by the period by which the output clock signal DQ or DQS exiting from the device is delayed in the subsequent, not illustrated, devices, and by the inherent delay of the input receiver 2 and of the output driver 24. The output signal FeedBack CLocK (FBCLK) is thus delayed vis-à-vis the first clock signal CLK or bCLK by same the period as with the exit from the semiconductor device following the output clock signal DQ in the signal path, the semiconductor device not being illustrated here.

By means of the phase comparing means 18 that includes the reference clock signal REFCLK and the signal FBCLK as input signals, the time situation, i.e. the phasing, of the two signals REFCLK and FBCLK with respect to each other is determined and transmitted to the control means 20 via the line 19. The control means 20 controls, via the control signals CTRL1 and CTRL2, the length of the delay values $T_1$ and $T_2$ and thus how long the signals $P_1$ or $P_2$, respectively, are delayed vis-à-vis the VDL_IN signal. The delay values $T_1$ and $T_2$ are, step by step, changed until equal signal edges of the signals REFCLK and FBCLK coincide in time. The signals $P_1$ and $P_2$ are such delayed vis-à-vis the first clock signal CLK or bCLK, respectively, by the desired duration $T_1$ or $T_2$, respectively, in a per se known manner.

The clock signals $P_1$ and $P_2$ are delayed vis-à-vis the signal VDL_IN by the same fraction of a clock, not, however, by the same number of entire clock cycles. One of the signals $P_1$ or $P_2$ is consequently delayed vis-à-vis the other one by an entire number of clock cycles. As a matter of principle, both signals $P_1$, $P_2$ may thus be selected as DCLK signal. In practice, however, that signal will be selected that was delayed less in the first delay means 6 and that is, due to the minor number of delay elements passed through, less distorted.

The clock signals $P_1$ and $P_2$ are transmitted to a phase comparing means 21. If, during the adjustment of the delay $T_1$ or $T_2$, a limit of the first delay means is achieved, there may be determined by means of this phase comparing means 21 at which other, new point of the first delay means 6, the point being shifted by at least one clock cycle, the corresponding signal $P_1$ or $P_2$ has to be tapped in the future. By means of the multiplexer 15 it is possible to switch to the respectively other clock signal, i.e. $P_2$ or $P_1$, as DCLK signal.

Finally, the device includes an output driver 24 that adapts the voltage of the DCLK signal in correspondence with the requirements of the devices following in the signal path of the output clock signal DQ.

The device thus enables, on the one hand, an adaptation of the duty cycle of the output clock signal DQ, on the other hand, the desired delay and synchronization of the output clock signal DQ, so that the output signals of the devices following in the signal path of the output clock are of equal phase to the input clock signal CLK or bCLK, respectively.

Figure 2:
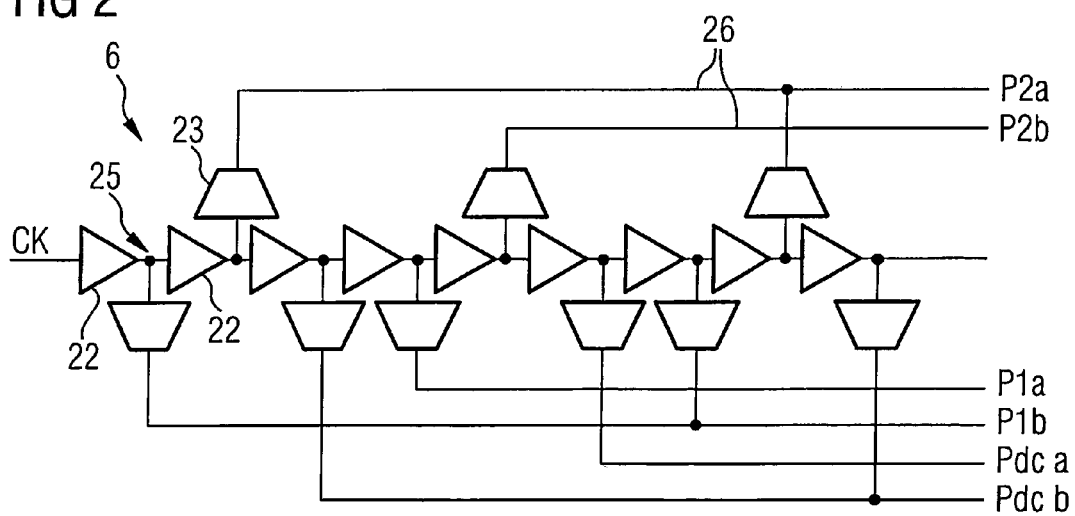
FIG. 2 illustrates a schematic representation of the first delay means used in FIG. 1.

FIG. 2 illustrates a schematic representation of a variable delay line as it may be used as first delay means 6 in FIG. 1. The delay means 6 includes a series connection of delay elements 22 delaying the clock signal CK fed from the left side—ideally—by the respective same duration. For each of the delayed clock signals $P_1$, $P_2$ and $P_{dc}$ two or more signals are respectively tapped between the delay means 22 at tapping positions 25. The tapping positions 25 may, corresponding to the control signals CTRL1, CTRL2 and $CTRL_{dc}$, be switched to the signal lines P1*a*, P1*b* and P2*a*, P2B as well as Pdca, Pdcb via the multiplexers 23, so that the amount of the time delay is controllable for each signal line. For generating a clock signal $P_1$, $P_2$ or $P_{dc}$ from the tapped signals, every two lines 26 with different tapping positions 25 are selected via the switching states of the multiplexers 23. Each pair of signals tapped for a clock signal $P_1$, $P_2$ or $P_{dc}$ is then transmitted to a phase interpolator that is not illustrated in the instant drawing, the phase interpolator generating, from the fed signals, a signal $P_1$, $P_2$ or $P_{dc}$ lying between the edges, and thus increasing the resolution of the delay chain.

Figure 3:
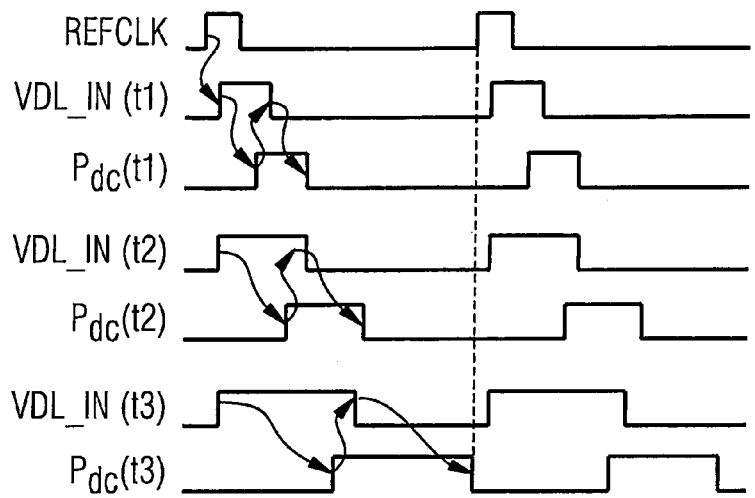
FIG. 3 illustrates a schematic representation of the clock signals during the correction of the duty cycle.

FIG. 3 illustrates a schematic representation of the time course of the reference clock signal REFCLK and of the signal $P_{dc}$ at the points in time t1, t2 and t3.

The reference clock signal REFCLK is unchanged at all points in time. It is therefore illustrated only once here. For illustration, the high level of the reference signal is very short in this example, so that the duty cycle of the signal $P_{dc}$ amounts to considerably less than the desired 50%. The dashed arrows indicate which signal edge is derived from which signal edge of another signal.

The point in time t=t1 indicates the switch-on time. At this point in time, the signal VDL_IN is delayed only slightly by the first delay means 6. The delay value $T_{dc}$ is almost Zero. The rising edge of the clock signal VDL_IN is delayed—vis-à-vis the rising edge of the reference clock signal REFCLK—by a very small period—i.e. shifted to the right—, which is caused by the inherent delay of the bistable trigger circuit 4. The rising edge of the signal $P_{dc}$ is the rising edge of the VDL_IN signal guided through the first delay means 6. The falling edge of the VDL_IN signal is effected by guiding the signal $P_{dc}$ to the RESET input of the bistable trigger circuit 4. The rising edge of the signal $P_{dc}$ effects that the bistable trigger circuit 4 sets its output level—back—to low and thus effects the falling edge of the VDL_IN signal. This falling edge of the VDL_IN signal passes—like the rising edge—through the first delay means 6. The rising edge of the next clock cycle is then again effected by the rising edge of the reference clock signal REFCLK as soon as it has been transmitted to the set input of the bistable trigger circuit 4.

At the point in time t2 the duration $T_{dc}$ has already been adjusted to a major value, so that the rising edge of the signal $P_{dc}$ exits—vis-à-vis the rising edge of the signal VDL_IN—from the first delay means 6 only after a longer delay—as compared to the point in time t1. However, as soon as the rising edge of the signal $P_{dc}$ has passed through the first delay means 6 and is thus present at the reset input of the bistable trigger circuit 4, this again effects the falling edge of the signal VDL_IN. The slight delay between the rising edge of the signal $P_{dc}$ and the falling edge of the signal VDL_IN remains unchanged since this is the inherent delay of the bistable trigger circuit 4. The falling edge of the VDL_IN is now delayed with the same value $T_{dc}$ as the rising edge in the first delay means 6 and is the falling edge in the signal $P_{dc}$ after this duration $T_{dc}$.

At the point in time t3, the delay time $T_{dc}$ has step by step been increased so much that the falling edge of the signal $P_{dc}$ coincides in time with the rising edge of the reference clock REFCLK. The delay value $T_{dc}$ now has the desired amount.

FIG. 4 illustrates a schematic representation of the signal tappings in the first delay means 6 with respect to the reference signal REFCLK in three different situations. Each small box symbolizes a delay element 22 of the first delay means 6. The indications in the small boxes symbolize the tappings for the respective signals $P_1$, $P_2$ and $P_{dc}$.

Figure 4A:
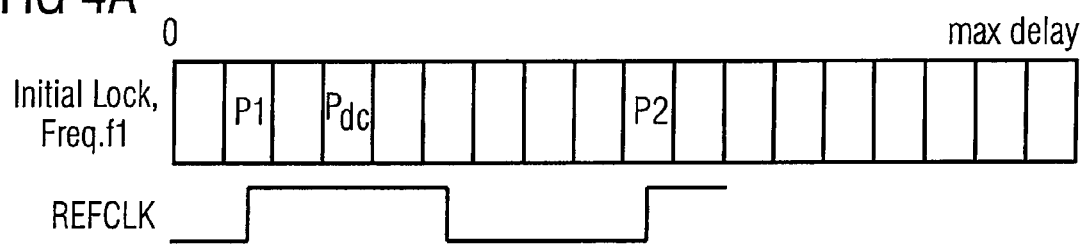
FIG. 4 illustrates a schematic representation of the signal tappings in the first delay means.

FIG. 4a illustrates the adjusted state at a constant clock frequency f1. The signal $P_1$ is tapped after one, the signal $P_{dc}$ after three, and the signal $P_2$ after seven delay elements 22. This state corresponds to the state illustrated in FIG. 2 in which the signal $P_1$ is also tapped after one, the signal $P_{dc}$ after three, and the signal $P_2$ after seven delay elements. As is illustrated here, the delay of the signal $P_2$ vis-à-vis $P_1$ is exactly one clock length.

Figure 4B:
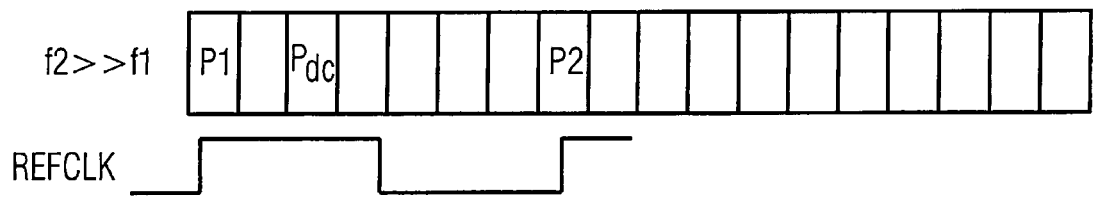

FIG. 4b illustrates an adjusted state at a constant clock frequency f2 which is substantially higher than the clock frequency f1. Due to the higher frequency f2, the delays of all signals are smaller than at the lower frequency f1. In particular the delay $T_{dc}$ of the signal $P_{dc}$, which is authoritative for the duty cycle, is reduced and thus adapted to the increased frequency and the resulting shorter clock duration. The delay of the signal $P_2$ vis-à-vis the signal $P_1$ is—like at the lower clock frequency f1—exactly one clock and is, due to the higher frequency and the resulting shorter clock duration, smaller vis-à-vis the corresponding delay at lower frequency.

Figure 4C:
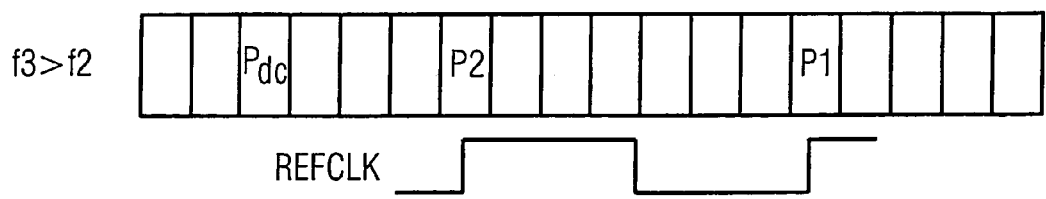

FIG. 4c illustrates an adjusted state at a clock frequency f3 that is slightly higher than the frequency f2. For adaptation of the delay of the clock signal $P_1$ to the shortened clock duration—vis-à-vis the frequency f2—the clock signal has to be delayed less, so that the clock signal $P_1$ has to be tapped between two delay elements at a tapping position located earlier in the first delay means 6. Since, however, the clock signal $P_1$ has already been tapped at the frequency f2 after one delay element 22—cf. FIG. 4b—the increase of the clock frequency results in that the tapping of the clock signal $P_1$ cannot continue to be changed to a smaller delay. This underflow results in that the clock signal $P_2$, the tapping of which has been adapted to the smaller clock duration, is switched as clock signal DCLK by means of the multiplexer.

By means of the phase comparing means 21 and the control means 20, a new tapping position is then determined in the first delay means 6 for the tapping of the clock signal $P_1$, the tapping position having a larger delay $T_1$ than the tapping of the clock signal $P_2$, wherein the delay is an integer multiple of the clock duration.

If, in the case of a further increase of the clock frequency, an underflow would occur again, so that the delay for the clock signal $P_2$ could not continue to be reduced, the clock signal $P_1$ could be switched as clock signal DCLK via the multiplexer 15.

The inventive device thus offers the function of a delay locked loop for the synchronization of an input clock signal CLK with an output clock signal DQS with simultaneous adjustment of the duty cycle of the output clock signal DQS to 50%.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A device for synchronizing an input clock signal with an output clock signal, comprising:
    first variable, controllable delay means for generating a first clock signal and at least a second clock signal from a clock signal fed to the first delay means;
    second delay means reproducing the characteristics of the delay of devices processing the output clock signal;
    first phase comparing means for determining the phase between the input clock signal and a clock signal delayed by the second delay means;
    first control means for controlling the delay of the second clock signal in the first delay means in correspondence with the phase determined by the first comparing means;
    a bistable trigger circuit for controlling the edges of the clock signal fed to the first delay means;
    second phase comparing means for determining the phase between the first clock signal delayed by means of the first delay means and the input clock signal; and
    second control means for controlling the delay of the first clock signal in correspondence with the phase determined by the second phase comparing means.

2. The device according to claim 1, wherein the input clock signal or a signal derived therefrom is guided to a set input, the first clock signal to a reset input of the bistable trigger circuit, and wherein the output signal thereof or a signal derived therefrom is guided to the first delay means as input signal.

3. The device according to claim 1, wherein the first delay means generates a third clock signal, and wherein, by means of a multiplexer, the second or the third clock signal of the first delay means is switched as input signal of the second delay means and simultaneously as output clock signal.

4. The device according to claim 3, wherein the second and the third clock signals are fed to a third phase comparing means, the output signal of which is fed to the first control means for controlling the delay of the second clock signal with reference to the third clock signal in the first delay means.

5. The device according to claim 1, the device further comprising an input device for adapting a signal level of the input clock signal.

6. The device according to claim 1, the device further comprising output means for adapting a level of the output clock signal to the devices following in the signal path of the output clock signal.

7. The device according to claim 1, wherein the first delay means is a tapped delay line with signal tappings for three pairs of clock signals.

8. The device according to claim 7, wherein the tapped delay line includes, for each pair of clock signals, a phase interpolator for generating a signal that lies between the phases of a clock signal pair with respect to time.

9. A method for synchronizing an input clock signal with an output clock signal, the method comprising:
   deriving a first clock signal derived from the input clock signal;
   deriving the output clock signal from the first clock signal which is derived from the input clock signal delayed with a second controllable delay time by means of controllable delay means;
   wherein edges of the input clock signal which have been delayed in the delay means with a first variable, controllable delay time, derive the respective first edges of the first clock signal from the input clock signal;
   respective second edges of the first derived clock signal which are inverse edges to the first edges are triggered by the exiting of the first edges of the first derived clock signal from the delay means; and
   determining the first delay time such that the respective second edges of the first derived clock signal coincide in time with every second edge of the input clock signal.

10. The method according to claim 9, wherein the input clock signal is fed to the one input of a bistable trigger circuit and the triggering of the respective second edges of the first derived clock signal is effected by that the first derived clock signal exiting from the delay means is fed to the other input of the bistable trigger circuit and that the output signal thereof is a input signal of the delay means.

11. The method according to claim 9, determining the delay of the first derived clock signal by a phase comparison between the input clock signal and the first derived clock signal exiting from the delay means.

12. The method according to claim 9, deriving a second and a third clock signal from the first derived clock signal by delaying with a second or third controllable delay time by means of the controllable delay means, wherein the second and third delay times differ by an integer multiple of a clock time; and
   switching the second or third clock signal as output clock signal by means of a multiplexer.

13. A device for synchronizing an input clock signal with an output clock signal, comprising:
   a first variable, controllable delay for generating a first clock signal and at least a second clock signal from a clock signal fed to the first delay;
   a second delay reproducing the characteristics of the delay of devices processing the output clock signal;
   a first phase comparator for determining the phase between the input clock signal and a clock signal delayed by the second delay;
   a first controller for controlling the delay of the second clock signal in the first delay in correspondence with the phase determined by the first phase comparator;
   a bistable trigger circuit for controlling the edges of the clock signal fed to the first delay;
   a second phase comparator for determining the phase between the first clock signal delayed by the first delay and the input clock signal; and
   a second controller for controlling the delay of the first clock signal in correspondence with the phase determined by the second phase comparator.

14. The device according to claim 13, wherein the input clock signal or a signal derived therefrom is guided to a set input, the first clock signal to a reset input of the bistable trigger circuit, and wherein the output signal thereof or a signal derived therefrom is guided to the first delay as input signal.

15. The device according to claim 13, wherein the first delay generates a third clock signal, and wherein, using a multiplexer, the second or the third clock signal of the first delay is switched as input signal of the second delay and simultaneously as output clock signal.

16. The device according to claim 15, wherein the second and the third clock signals are fed to a third phase comparator, the output signal of which is fed to the first controller for controlling the delay of the second clock signal with reference to the third clock signal in the first delay.

17. The device according to claim 16, the device further comprising an input device for adapting a signal level of the input clock signal.

18. The device according to claim 13, the device further comprising an output system for adapting a signal level of the output clock signal to the devices following in the signal path of the output clock signal.

19. The device according to claim 13, wherein the first delay is a tapped delay line with signal tappings for three pairs of clock signals.

20. The device according to claim 19, wherein the tapped delay line includes, for each pair of clock signals, a phase interpolator for generating a signal that lies between the phases of a clock signal pair with respect to time.

21. A device for synchronizing an input clock signal with an output clock signal, comprising:
   a first variable, controllable delay for generating a first clock signal and at least a second clock signal from a clock signal fed to the first delay;
   a second delay;
   a first phase comparator;
   a first controller;
   a bistable trigger circuit for controlling the edges of the clock signal fed to the first delay;
   a second phase comparator for determining the phase between the first clock signal delayed by the first delay and the input clock signal; and
   a controller for controlling the delay of the first clock signal in correspondence with the phase determined by the second phase comparator.

22. A method for synchronizing an input clock signal with an output clock signal, comprising:
   generating a first clock signal and at least a second clock signal from a clock signal fed to a first variable, controllable delay;
   determining by a first phase comparator the phase between the input clock signal and a clock signal delayed by a second delay;
   controlling the delay of the second clock signal in the first delay in correspondence with the phase determined by the first phase comparator;

controlling the edges of the clock signal fed to the first delay by a bistable trigger circuit;

determining the phase between the first clock signal delayed by the first delay and the input clock signal by a second phase comparator; and controlling the delay of the first clock signal in correspondence with the phase determined by the second phase comparator.

* * * * *